US009558916B2

(12) United States Patent
Muraki et al.

(10) Patent No.: US 9,558,916 B2
(45) Date of Patent: Jan. 31, 2017

(54) LITHOGRAPHY SYSTEM AND METHOD OF MANUFACTURING ARTICLES

(71) Applicant: CANON KABUSHIKI KAISHA, Tokyo (JP)

(72) Inventors: Masato Muraki, Inagi (JP); Yoshihiro Hirata, Fuchu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/919,468

(22) Filed: Oct. 21, 2015

(65) Prior Publication Data

US 2016/0118221 A1 Apr. 28, 2016

(30) Foreign Application Priority Data

Oct. 27, 2014 (JP) ................................ 2014-218718

(51) Int. Cl.
| | |
|---|---|
| G21K 5/10 | (2006.01) |
| H01J 3/14 | (2006.01) |
| G21K 5/00 | (2006.01) |
| H01J 37/317 | (2006.01) |

(52) U.S. Cl.
CPC .. H01J 37/3174 (2013.01); *H01J 2237/31762* (2013.01); *H01J 2237/31764* (2013.01); *H01J 2237/31774* (2013.01)

(58) Field of Classification Search
USPC ......... 250/310, 396 R, 492.1, 492.2, 492.22, 250/492.3
See application file for complete search history.

(56) References Cited

U.S. PATENT DOCUMENTS

| | | | | |
|---|---|---|---|---|
| 4,532,598 A * | 7/1985 | Shibayama | ......... | H01J 37/3026 250/398 |
| 4,816,692 A * | 3/1989 | Rudert, Jr. | .......... | H01J 37/3026 250/492.2 |
| 4,853,870 A * | 8/1989 | Yasutake | ................ | B82Y 10/00 250/396 R |
| 4,870,286 A * | 9/1989 | Tobuse | ................ | H01J 37/3023 250/398 |
| 2001/0017355 A1* | 8/2001 | Mizuno | ............... | H01J 37/3026 250/492.22 |

(Continued)

FOREIGN PATENT DOCUMENTS

| | | |
|---|---|---|
| JP | 2004-172428 A | 6/2004 |
| JP | 2006-019434 A | 1/2006 |

*Primary Examiner* — Bernard Souw
(74) *Attorney, Agent, or Firm* — Canon USA, Inc. I.P. Division

(57) ABSTRACT

At least one method of manufacturing articles and at least one lithography system are provided herein. A lithography system according to an exemplary embodiment of the present disclosure includes a drawing apparatus that includes a plurality of optical systems and draws a pattern on a substrate with beams having been respectively shaped by the plurality of optical systems, and a transmission unit configured to select pattern data to be used by the drawing apparatus from a plurality of types of pattern data commonly used by the plurality of optical systems and configured to transmit the selected pattern data to the drawing apparatus. The pattern data is a set of data including a plurality of sub pattern data, and a width of a stripe-shaped drawing region corresponding to one sub pattern data piece is equivalent to a length obtainable by dividing a drawing width of the beams by an integer value.

6 Claims, 9 Drawing Sheets

(56) References Cited

U.S. PATENT DOCUMENTS

| | | | |
|---|---|---|---|
| 2006/0169926 A1* | 8/2006 | Mizuno | H01J 37/3026 250/492.22 |
| 2009/0187878 A1* | 7/2009 | Ogino | B82Y 10/00 716/55 |
| 2016/0126062 A1* | 5/2016 | Muraki | H01J 37/3007 250/492.3 |

* cited by examiner

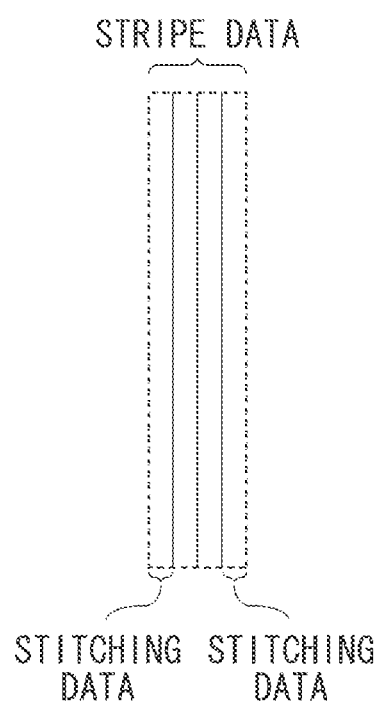

LITHOGRAPHY SYSTEM AND METHOD OF MANUFACTURING ARTICLES

BACKGROUND OF THE INVENTION

Field of the Invention

The present disclosure relates to a lithography system and a method of manufacturing articles.

Description of the Related Art

There is a conventional drawing apparatus that includes a plurality of electronic optical systems (hereinafter, simply referred to as "optical systems") capable of emitting a plurality of electron beams to draw a pattern on a substrate. For example, in a case where the optical systems are arrayed in a row on a horizontal surface, each optical system can draw a pattern in each stripe-shaped region having a long side extending in a direction perpendicular to the array direction. The plurality of optical systems can simultaneously draw patterns in different shot regions.

In this case, it is desired that there is an integer ratio relationship between a distance between optical axes of neighboring optical systems in the array direction and a pitch of the shot region in the same direction. Processing for converting graphic design data relating to a drawing pattern, such as a circuit pattern, into pattern data can be commonalized with processing for transferring the converted pattern data to each optical system.

However, if the size of the shot region is variable, the above-mentioned relationship may become a non-integer ratio and commonalizing the pattern data will become difficult. Therefore, as discussed in Japanese Patent Application Laid-Open No. 2004-172428, it is conventionally known that the drawing apparatus can be configured to include a plurality of optical systems arrayed on a support member rotatable around a rotational axis extending in a vertical direction. The above-mentioned conventional drawing apparatus can adjust the distance between optical axes of respective optical systems by selecting an appropriate rotational angle of the support member. However, even in the drawing apparatus discussed in Japanese Patent Application Laid-Open No. 2004-172428, the positions of the plurality of optical systems may change with time elapsed and it will be necessary to perform the above-mentioned processing for converting the graphic design data into pattern data again.

SUMMARY OF THE INVENTION

Exemplary embodiments of the present disclosure intend to provide a lithography system that is capable of commonalizing pattern data in an event of occurrence of a positional deviation in a plurality of optical systems.

At least one lithography system according to an exemplary embodiment of the present disclosure includes a drawing apparatus that includes a plurality of optical systems and draws a pattern on a substrate with beams having been respectively shaped by the plurality of optical systems, and a transmission unit configured to select pattern data to be used by the drawing apparatus from a plurality of types of pattern data commonly used by the plurality of optical systems and configured to transmit the selected pattern data to the drawing apparatus. The pattern data is a set of data including a plurality of sub pattern data, and a width of a stripe-shaped drawing region corresponding to one sub pattern data piece is equivalent to a length obtainable by dividing a drawing width of the beams by an integer value.

According to other aspects of the present disclosure, one or more additional lithography systems and one or more methods of manufacturing articles are discussed herein. Further features of the present disclosure will become apparent from the following description of exemplary embodiments with reference to the attached drawings.

BRIEF DESCRIPTION OF THE DRAWINGS

FIG. 9 illustrates stitching data.

DESCRIPTION OF THE EMBODIMENTS

Figure 1:
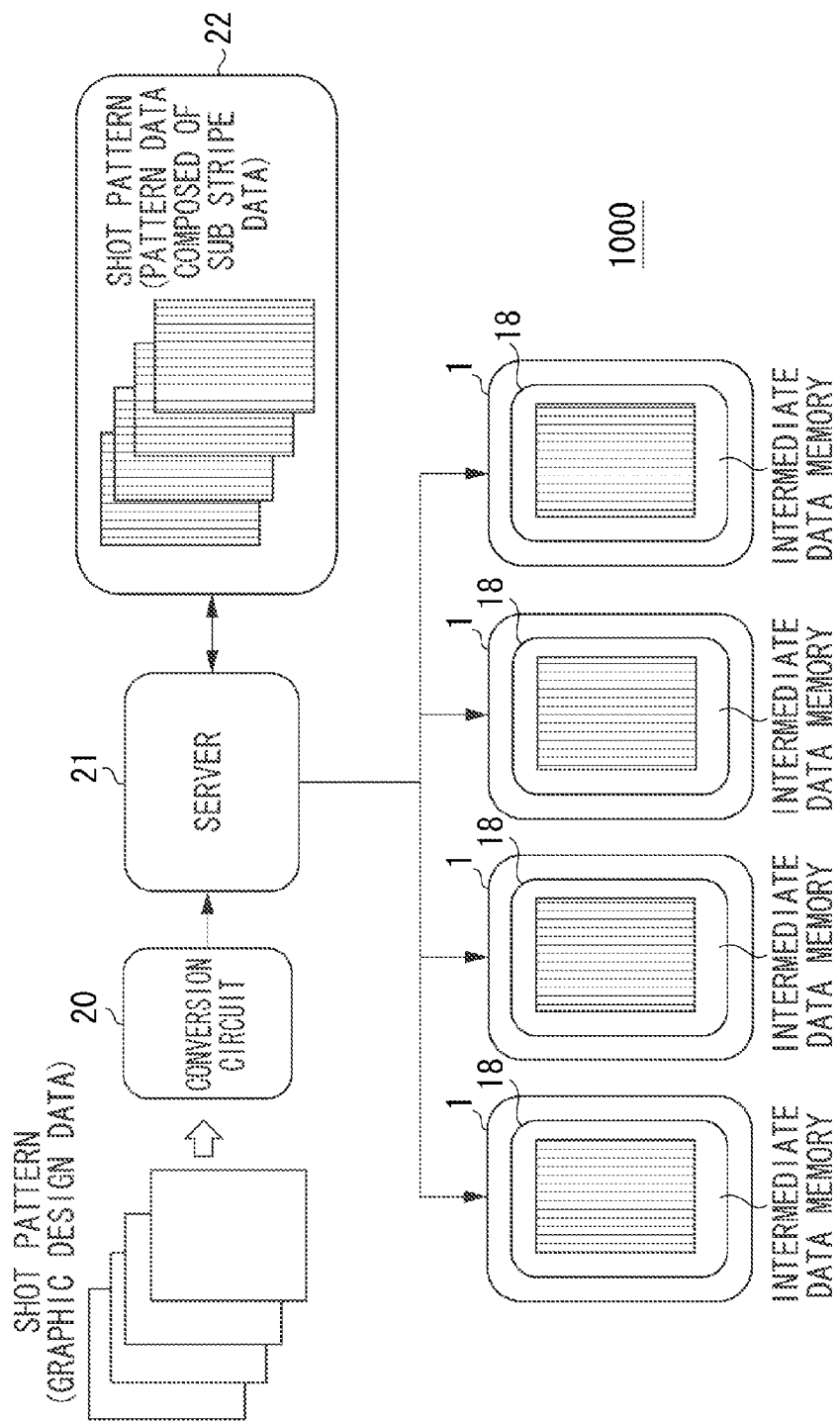
FIG. 1 is a configuration diagram illustrating a lithography system.

A first exemplary embodiment will be described in detail below. FIG. 1 is a configuration diagram illustrating a lithography system 1000 according to the first and second exemplary embodiments. The lithography system 1000 includes four electron beam drawing apparatuses 1 (hereinafter, simply referred to as "drawing apparatus 1").

The lithography system 1000 includes a conversion circuit 20 that can convert shot pattern related graphic design data into pattern data and a main memory (i.e., a storage unit) 22 that can store the converted pattern data. In other words, the conversion circuit 20 can create pattern data. The main memory 22 stores a plurality of types of pattern data that have been converted from a plurality of types of graphic design data.

Further, the lithography system 1000 includes a server (i.e., a transmission unit) 21. The server 21 is capable of causing the main memory 22 to store the converted pattern data. Further, the server 21 can select appropriate shot pattern related pattern data from the main memory 22 and can transfer the selected pattern data to an intermediate data memory 18 (hereinafter, simply referred to as "intermediate memory 18") of each drawing apparatus 1.

In the present exemplary embodiment, the shot pattern is a pattern formation unit relating to a single chip pattern or a plurality of chip patterns. It is desired that the size of the shot pattern and a processing unit of other lithography or processing apparatus are mutually in common. For example, the width of the shot pattern in a shorter direction is appropriately 20 mm to 25 mm. The graphic design data is, for example, vector format data. Further, the pattern data is, for example, bitmap format image data. The pattern data is chip pattern related data or shot pattern data, which is a minimum repetition unit of a plurality of patterns to be formed on a substrate. In the present exemplary embodiment, unit data of the pattern data is sub stripe data (i.e., sub pattern data) described below. The conversion circuit 20 can perform data conversion and data transfer processing according to methods described in detail below.

Figure 2:
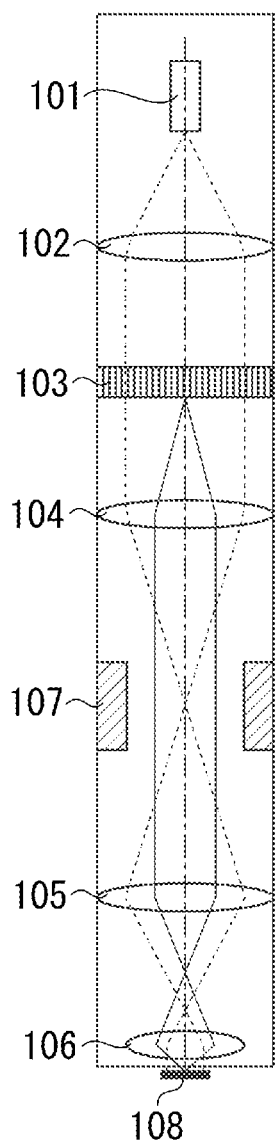
FIG. 2 is a configuration diagram illustrating an optical system.

FIG. 2 illustrates a configuration of an optical system 100 provided in each drawing apparatus 1. An electron source 101, which is capable of emitting electron beams, is a thermionic-type electron source that includes an electron emission material (e.g., $LaB_6$ or BaO/W). A collimator lens 102 is an electrostatic-type lens, which is capable of converging electron beams under application of an electric field.

When the collimator lens 102 receives the electron beams emitted from the electron source 101, the collimator lens 102 shapes the received electron beams into parallel beams.

A blanking aperture array 103 can split an electron beam having passed through the collimator lens 101 into a plurality of electron beams with two-dimensionally arranged apertures (not illustrated). Further, the blanking aperture array 103 includes electrostatic-type blankers (not illustrated) that can individually deflect the plurality of electron beams having been split by the apertures according to an instruction from a blanking control circuit 13 described below. Through the above-mentioned deflecting operation, irradiation and non-irradiation of a drawing region 108 of the optical system 100 with the electron beam can be controlled.

A lens 104 is an electrostatic-type electron lens. A lens 105 is an electromagnetic-type electron lens. The lens 104 and the lens 105 can form intermediate images of the electron beams at the plurality of apertures of the blanking aperture array 103.

A lens 106 is an electromagnetic-type electron lens. The lens 106 is functionally operable as an objective lens in the optical system 100. The lens 106 can project intermediate images formed by the lens 104 and the lens 105 on the drawing region 108. A deflector 107 can deflect the plurality of electron beams in a batch fashion in a predetermined direction and can precisely adjust the position of the drawing region 108 in relation to a wafer (i.e., a substrate) 10 illustrated in FIG. 3.

Figure 3:
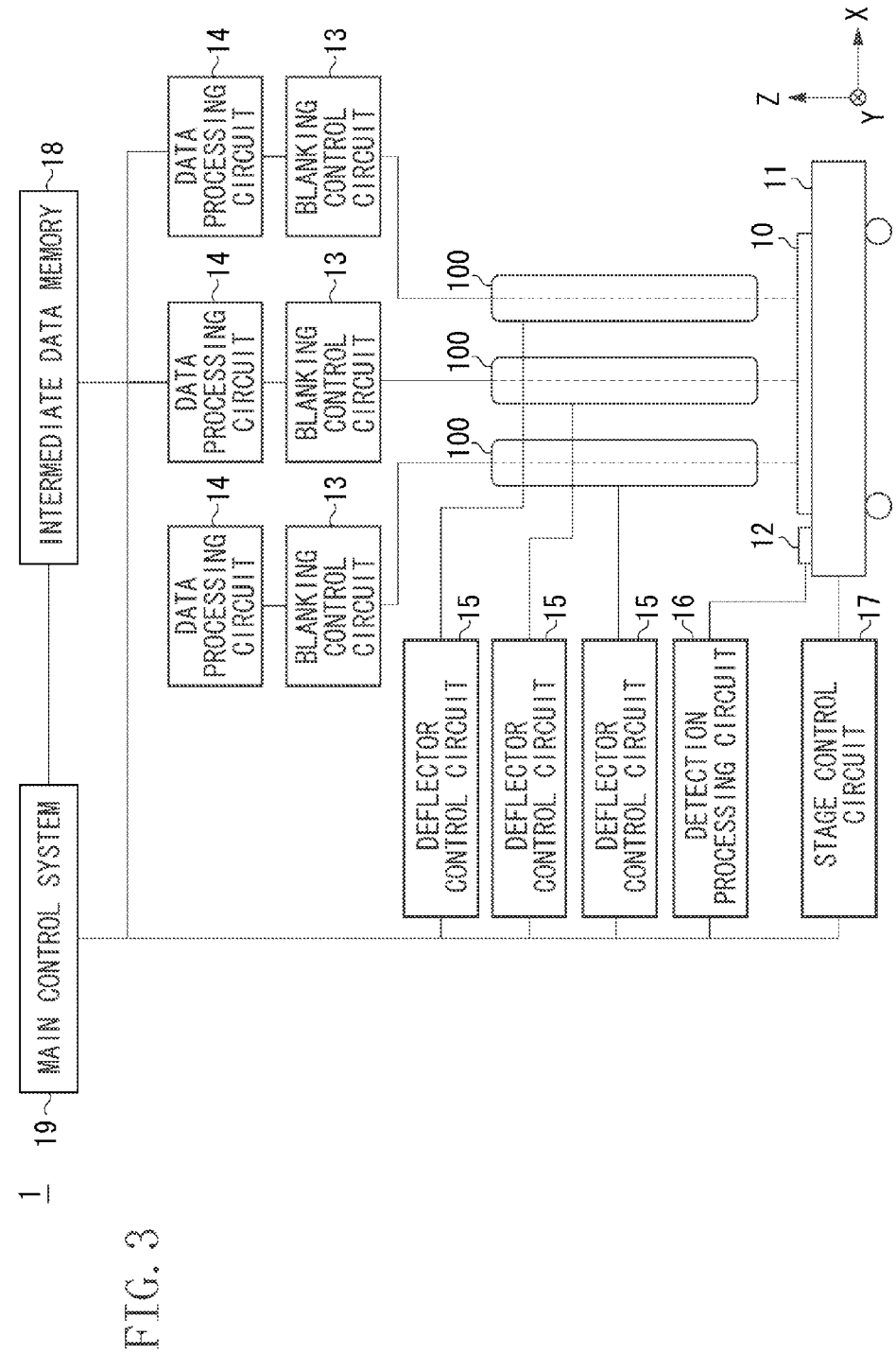
FIG. 3 is a configuration diagram illustrating a drawing apparatus.

FIG. 3 illustrates a configuration of each drawing apparatus 1. Each drawing apparatus 1 includes three optical systems 100. Each of the electron beams having been shaped by respective optical systems 100 draws a pattern on the wafer 10. A stage 11 is movable in an XY plane perpendicular to the optical axis of the optical system 100 in a state where an electrostatic chuck (not illustrated) sucks and holds the wafer 10. A detector 12 is mounted on the stage 11. The detector 12 can detect the position of an electron beam and a related current value.

The blanking control circuit 13 can individually control the driving of the plurality of blankers provided in the blanking aperture array 103. A data processing circuit 14 includes memories 14b and 14d (illustrated in FIG. 8) and data processing circuits 14a and 14c (illustrated in FIG. 8). The data processing circuits 14a and 14c can generate stripe data that are required in the control of the blanking aperture array 103 provided in each optical system 100.

A deflector control circuit 15 can control the deflector 107 of each optical system 100. A detection processing circuit 16 can calculate actual array coordinates and current values of a plurality of electron beams based on a signal from the detector 12. A stage control circuit 17 can control the positioning of the stage 11 with reference to a measurement result with respect to the position of the stage 11 obtained by a laser interferometer (not illustrated).

The intermediate memory 18 is a memory capable of storing one piece of the pattern data relating to a plurality of types of shot patterns stored in the main memory 22.

A main control system 19 requests the server 21 to supply pattern data corresponding to a shot pattern to be drawn by the drawing apparatus 1. In response to the above-mentioned request, the server 21 transfers the pattern data to the intermediate memory 18. Further, the main control system 19 can control the blanking control circuit 13, the data processing circuit 14, the deflector control circuit 15, the detection processing circuit 16, and the stage control circuit 17 in an integrated manner.

In the present exemplary embodiment, a control unit of the drawing apparatus 1 is constituted by the blanking control circuit 13, the data processing circuit 14, the deflector control circuit 15, the detection processing circuit 16, the stage control circuit 17, and the main control system 19. However, the control unit of the drawing apparatus 1 is changeable appropriately.

Figure 4A:
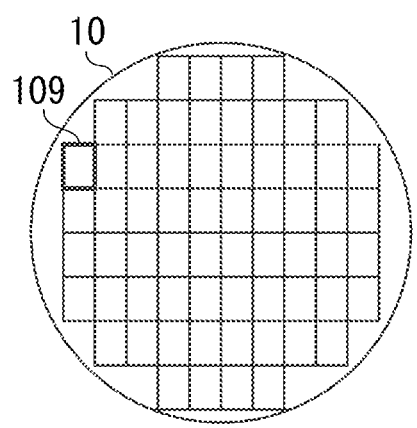
FIGS. 4A and 4B illustrate drawing regions.
Figure 4B:
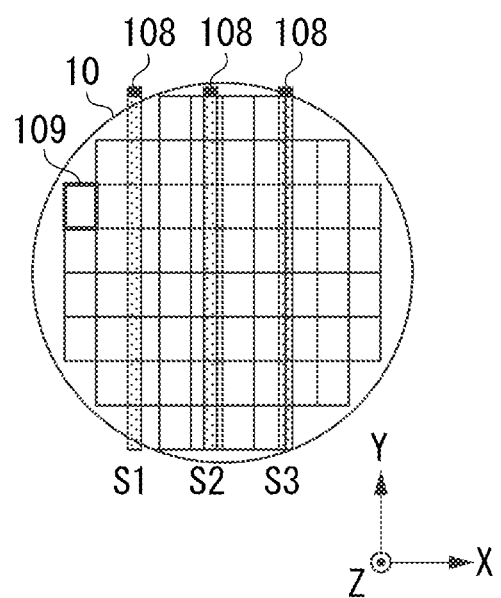

FIGS. 4A and 4B are illustrations relating to the formation of a plurality of drawing regions. FIG. 4A illustrates an arrangement example of a shot region 109 to be drawn on the wafer 10 or an arrangement example of an already formed shot region 109. FIG. 4B illustrates a relationship between three drawing regions 108, which have been formed with electron beams arrayed in an X-axis direction, and the wafer 10.

When the stage 11 on which the wafer 10 is mounted moves in a Y-axis direction (i.e., a direction perpendicular to the X-axis direction), the drawing regions 108 of three optical systems 100 can perform scanning on the wafer 10. Each of three optical systems 100 controls irradiation (ON) and non-irradiation (OFF) of the electron beam based on stripe data corresponding to a stripe region (i.e., a stripe-shaped drawing region), so that a pattern can be drawn in each of stripe regions (S1, S2, and S3).

Figure 5A:
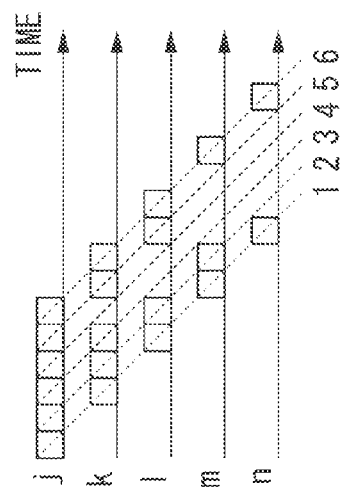
FIGS. 5A, 5B, and 5C illustrate a drawing method.
Figure 5C:
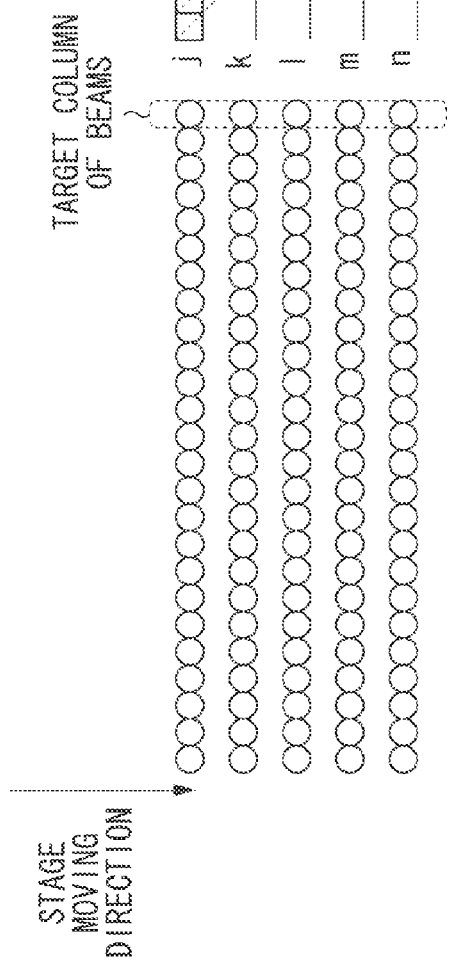
Figure 5B:
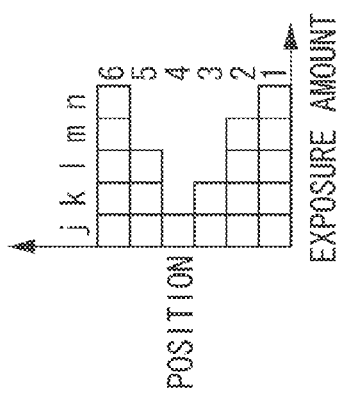

FIGS. 5A, 5B, and 5C illustrate drawing method accompanied by a gradation control. FIG. 5A illustrates an arrangement of electron beams that cooperatively constitute the drawing region 108. The electron beams split by the blanking aperture array 103 constitute a matrix of 5 rows and 20 columns. The pitch according to which five rows are arranged is two times the pitch according to which twenty columns are arranged.

If the stage 11 moves from top to bottom in the vertical direction as illustrated in FIG. 5A, each optical system 100 successively performs a scanning operation with electron beams arranged in j, k, l, m, and n rows of a target column at respective positions on the wafer 10.

FIG. 5B illustrates a relationship between exposure amount level (Dose) and positions (1) to (6) on the wafer 10. For example, the optical system 100 irradiates the position (1) at the exposure amount level 5 by using the electron beams of j, k, l, m, and n rows. The optical system 100 irradiates the wafer 10 with all electron beams based on a clock signal. The stage 11 continuously moves at a speed corresponding to the column pitch per clock.

FIG. 5C is a timetable illustrating ON/OFF signals having been set based on the data illustrated in FIG. 5B. More specifically, the timetable illustrates ON/OFF signals of the electron beams belonging to respective rows (j to n rows) that expose the positions (1) to (6) of the wafer 10 arranged in the moving direction of the stage 11. The stage 11 moves by an amount corresponding to one pitch in response to two unit clocks.

The width of the column of electron beams is equivalent to the drawing width of the optical system 100 and corresponds to the width of the stripe region. For example, in a case where 4000 beams per column are disposed at pitches of several tens nm, the width of the stripe region is approximately 80 μm to 100 μm. The drawing width is the width of each of stripe regions S1, S2, and S3 in the X-axis direction illustrated in FIG. 4B.

Subsequently, pattern data conversion processing that can be performed by the lithography system 1000 and a related drawing method of the lithography system will be described in detail below.

Figure 6:
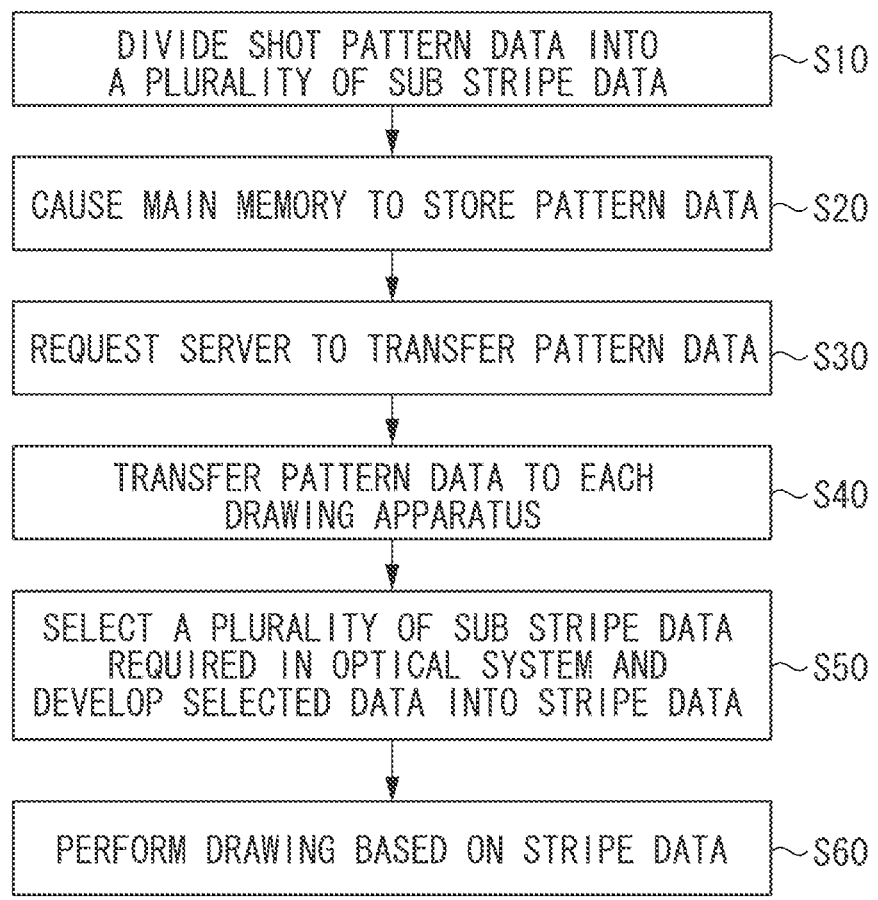
FIG. 6 is a flowchart illustrating a data flow.

FIG. 6 is a flowchart illustrating a data flow in the lithography system 1000. First, in step S10, the conversion circuit 20 divides shot pattern related graphic design data by an integer value in such a way as to match the width of a sub stripe region. Then, the conversion circuit 20 compresses each piece of sub stripe data converted into bitmap format data.

Figure 7:
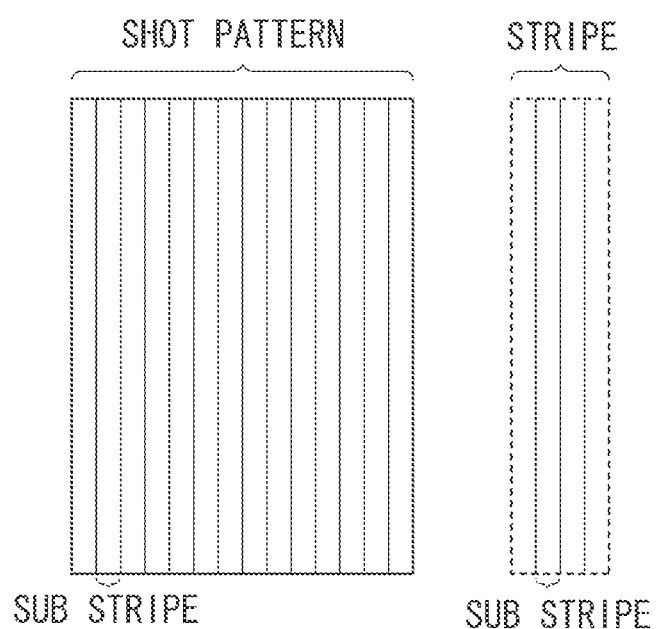
FIG. 7 illustrates data division.

FIG. 7 illustrates a relationship among a shot region corresponding to pattern data, a sub stripe region corresponding to sub stripe data, and a stripe region corresponding to stripe data. As illustrated in FIG. 7, each of the shot pattern related pattern data and the stripe data is a set of data including a plurality of sub stripe data, in which the sub stripe data is the unit data.

The conversion circuit 20 divides the graphic design data in such a manner that the width (e.g., 5 µm to 10 µm) of the sub stripe region becomes equivalent to a length obtainable by dividing the stripe region (e.g., 80 µm to 100 µm) by an integer value. More specifically, the width of the sub stripe region is equivalent to a length obtainable by dividing the drawing width of a plurality of electron beams by an integer value. The conversion circuit 20 determines the width of the sub stripe region based on a deflection width obtained by the deflector 107, the width of the stripe region (i.e., the width of the drawing region 108), and the width of the shot region. Fine adjustment of the irradiation position can be performed by the deflector 107.

Referring back to FIG. 6, the conversion circuit 20 transfers the sub stripe data to the server 21. In step S20, the server 21 causes the main memory 22 to store the converted pattern data. Similarly, the conversion circuit 20 converts other shot pattern related graphic design data into pattern data and causes the main memory 22 to store a plurality of types of pattern data.

If the shot pattern to be drawn by the drawing apparatus 1 is determined, then in step S30, the main control system 19 of the drawing apparatus 1 requests the server 21 to transfer pattern data relating to the determined shot pattern. The server 21 selects the requested pattern data from the plurality of types of pattern data stored in the main memory 22. Then, in step S40, the server 21 transfers the selected pattern data to the intermediate memory 18 of the drawing apparatus 1 (i.e., the request source).

The data processing circuit 14 successively converts the stripe data to be used by the optical system 100. To this end, the main control system 19 of the drawing apparatus 1 selects and extracts a part of the pattern data transferred to the intermediate memory 19 and determines a selection condition to distribute the sub stripe data required in each optical system 100. The selection condition indicates the number of sub stripe data while regarding an edge position of the drawing region 108 of each optical system 100 as a start point.

The edge position of the drawing region 108 can be determined based on a relative positional relationship between the layout of the shot region and the optical system 100. The number of sub stripe data can be determined based on the drawing width of the drawing region 108 in a drawing width direction (i.e., the above-mentioned X-axis direction).

In this case, it is desired that the positions of the drawing regions 108 indicating the positions of the optical axes relating to a plurality of optical systems 100 (i.e., positional information about beams relating to the plurality of optical systems) are not positions obtainable from design values, but positions based on actually measured values. Mechanical machining accuracy and assembling accuracy of each drawing apparatus 1 are factors that may cause a deviation in the distance between the optical systems 100 of each drawing apparatus 1. In such a case, it is useful to differentiate the selection condition for each drawing apparatus 1.

Further, a relative positional relationship between respective optical systems 100 may vary with time elapsed due to vibration in a drawing operation. Therefore, it is desired to periodically update the positional information about the electron beams and update the selection condition correspondingly.

In response to a drawing command, the main control unit 19 (e.g., a computer) instructs the data processing circuit 14 to select a plurality of sub stripe data to be processed by the data processing circuit 14. In step S50, the data processing circuit 14 selects a plurality of sub stripe data to be used by the optical system 100 (i.e., the connecting destination of the data processing circuit 14) according to the above-mentioned selection condition and develops the selected data.

Figure 8:
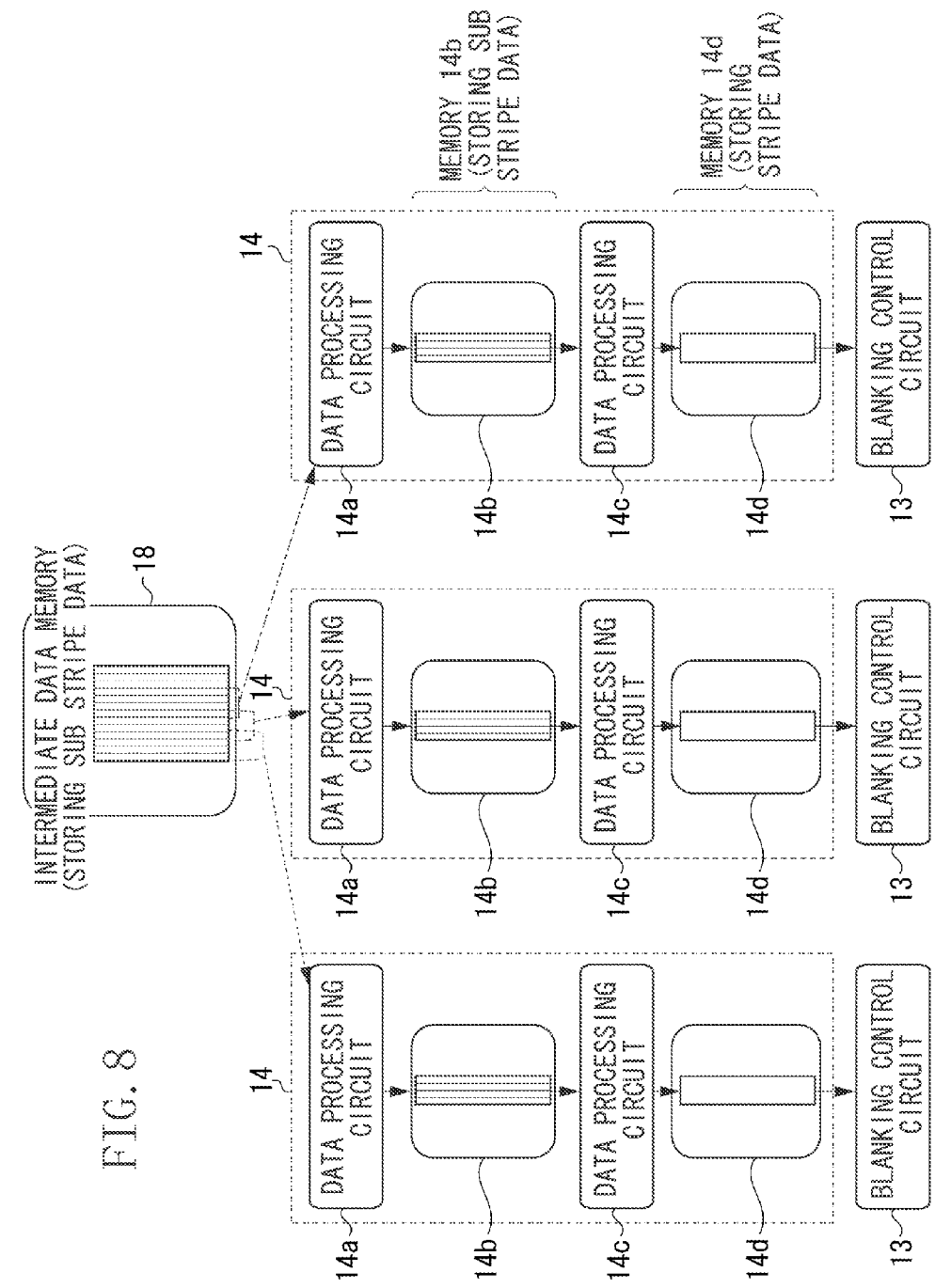
FIG. 8 illustrates data conversion.

The data conversion processing (to be performed in step S50) will be described in detail below with reference to a schematic view illustrated in FIG. 8. The data processing circuit 14a (i.e., a selection unit) of the data processing circuit 14 selects a plurality of sub stripe data according to the above-mentioned selection condition. Then, the data processing circuit 14a causes the memory 14b to store the selected sub stripe data temporarily. The data processing circuit 14c develops compression data of the sub stripe data relating to the stripe data and performs correction processing (e.g., aberration correction) peculiar to each optical system 100. The data processing circuit 14c causes the memory 14d to store the generated stripe data. The memory 14d is a two-sided buffer memory capable of storing two stripe data.

Referring back to FIG. 7, the blanking control circuit 13 creates irradiation control data to control the blanking aperture array 103 based on the generated stripe data. In step S60, the main control unit 19 draws a pattern on the wafer 10 based on the irradiation control data created by the blanking control circuit 13.

The main control unit 19 causes the blanking control circuit 13 to control the blanking aperture array 103 and causes the stage control circuit 17 to control the movement of the stage 11. The main control unit 19 causes the drawing apparatus to draw a drawing region corresponding to stripe data corresponding to one stripe region, which is a part of the data stored in the buffer memory 14d of each optical system 100.

If the drawing apparatus terminates a drawing operation for one stripe region, the main control system 19 reads the next stripe data from the other memory of the two-sided buffer memory 14d. The main control unit 19 causes the drawing apparatus to draw the next stripe region based on the readout stripe data. While performing the drawing operation of the second stripe region, the data control circuit 14a further selects stripe data to be drawn next according to a method similar to the above-mentioned method. The data processing circuit 14c develops stripe data constituted by compressed sub stripe data and overwrites the one memory of the buffer memory 14d, which stores the stripe data having been already subjected to the drawing operation, with the developed data.

The data processing circuit 14a successively selects sub stripe data required for the optical system 100, develops the selected sub stripe data, and causes the memory 14d to store the developed sub stripe data. Successively generating stripe data is useful because it is unnecessary to store pattern data corresponding to one-shot pattern for each optical system 100. Therefore, it becomes feasible to prevent the package size from increasing and reduce the costs.

In the lithography system according to the present exemplary embodiment, the main memory 22 stores a wide variety of shot pattern related pattern data that are divided into multiple sub stripe data. Each drawing apparatus 1 can generate stripe data necessary for each optical system 100 by selecting and combining a plurality of sub stripe data.

In other words, different optical systems can commonly use the same pattern data. Even in a case where the optical axis position of the optical system 100 deviates from a designed position, it is feasible to use the same pattern data because the data processing circuit 14 can select different stripe data. Accordingly, even in a case where a device difference occurs with respect to the optical system position between different drawing apparatuses, commonly using the same pattern data is feasible.

Further, even in a case where a positional deviation of the optical axis occurs with time elapsed, the main control system 19 needs only to change the selection condition and the data processing circuit 14 needs only to select a different combination of sub stripe data for each optical system 100. Therefore, by performing processing for converting graphic design data into pattern data (i.e., the conversion requiring the longest processing time in various data conversions) while performing a drawing operation, it is feasible to cause the main memory 22 to store the obtained data together. The pattern data having been already subjected to the conversion processing can be used in an event of positional deviation occurring in the optical system. Therefore, the present exemplary embodiment brings an effect of preventing the throughput from deteriorating, compared to a case where the apparatus performs the conversion into pattern data each time the drawing of one pattern completes.

As mentioned above, even when a switching of patterns causes an alignment change, the drawing apparatus can use already stored data to immediately draw the next shot pattern.

The second exemplary embodiment will be described in detail below. The above-mentioned first exemplary embodiment is characterized by non-overlapped regions drawn with respective electron beams. However, there will be a possibility of splitting the pattern at the boundary between stripe regions if a deviation occurs in drawing position due to the influence of radiation to the wafer 10. In such a case, neighboring regions will be drawn while they are partly overlapped.

A lithography system according to a second exemplary embodiment is substantially similar to the lithography system 1000 in configuration. The second exemplary embodiment is different from the first exemplary embodiment in that a moving amount of the stage 11 during a single shift operation when the stage control unit 17 causes the stage 11 to move in the X-axis direction is set to be shorter than the width of the drawing region 108. Further, the second exemplary embodiment is characterized in that the data processing circuit 14a designates one sub stripe data piece positioned at each end of the selected plurality of sub stripe data (i.e., a part of the sub pattern data) as stitching data for regions to be drawn in an overlapped fashion (i.e., sub pattern data dedicated to a multiplex drawing region).

The stitching data is subjected to data correction according to predetermined rules (which includes halving the exposure amount) to generate stripe data. Even in a case where the drawing apparatus performs a drawing operation in such a way as to overlap neighboring stripe regions at both ends thereof, the drawing apparatus can change a combination of sub stripe data to be selected to solve the problems caused by device differences of the drawing apparatus 1 and positional deviation of the optical axis of the optical system 100.

[Other Exemplary Embodiment]

The main memory 22 can be constituted as a single mass storage memory or a combination of a plurality of memories. The server 21 can be modified appropriately if it is accessible to a plurality of types of pattern data and it is capable of transferring required pattern data to the drawing apparatus 1.

The number of drawing apparatuses included in the lithography system is not limited to a specific value. Further, the present invent is applicable not only when two or more drawing apparatuses draw the same pattern but also when the apparatuses draw different patterns as described in the first and second exemplary embodiments.

Even in a case where the drawing width is different in each optical system, it is feasible to use common pattern data. If the drawing apparatus performs a drawing operation by changing the drawing region of one optical system to have a predetermined width, the predetermined width corresponds to the drawing width of the beam.

The device controlling the irradiation and/or non-irradiation of each electron beam is not limited to the blanking aperture array 103. Any other device is employable if it can control the exposure amounts of a plurality of electron beams and irradiation and/or non-irradiation for each electron beam based on drawing data. The number of optical systems and the number of beams of each optical system are not limited to the examples described in the first and second exemplary embodiments and can be changed appropriately.

The first and second exemplary embodiments have been described with reference to the drawing apparatuses that can draw patterns with electron beams. However, the drawing apparatus applicable to the lithography system according to the present disclosure is not limited to the above-mentioned examples. For example, the drawing apparatus can be configured to draw a pattern on a substrate with charged particle beam (e.g., ion beam), KrF excimer laser beam, ArF excimer laser beam, or EUV light.

[Method of Manufacturing Articles]

A method of manufacturing articles (e.g., a semiconductor integrated circuit element, a liquid crystal element, an image sensor, a magnetic head, a CD-RW, an optical element, or a photomask) according to an exemplary embodiment of the present disclosure includes a process of drawing a pattern on a substrate (e.g., a wafer or a glass plate) with the above-mentioned drawing apparatus and a process of developing the drawn substrate. Further, the method of manufacturing articles can include other conventionally known processing processes (e.g., oxidation, film formation, evaporation, flattening, etching, resist stripping, dicing, bonding, and packaging).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-218718, filed Oct. 27, 2014, which is hereby incorporated by reference herein in its entirety.

What is claimed is:

1. A lithography system comprising:
a drawing apparatus that includes a plurality of optical systems and draws a pattern on a substrate with beams having been respectively shaped by the plurality of optical systems; and
a transmission unit configured to select pattern data to be used by the drawing apparatus from a plurality of types of pattern data commonly used by the plurality of optical systems and configured to transmit the selected pattern data to the drawing apparatus,
wherein the pattern data is a set of data including a plurality of sub pattern data, and a width of a stripe-shaped drawing region corresponding to one sub pattern data piece is equivalent to a length obtainable by dividing a drawing width of the beams by an integer value.

2. The lithography system according to claim 1, wherein the drawing apparatus includes a selection unit configured to select the plurality of sub pattern data to be used in each of the plurality of optical systems based on positional information about the beams relative to the plurality of optical systems and the drawing width of the beams.

3. The lithography system according to claim 2, wherein the selection unit is configured to designate a part of the selected plurality of sub pattern data as sub pattern data dedicated to a multiplex drawing region.

4. The lithography system according to claim 2, wherein the drawing apparatus updates the positional information about the beams relative to the plurality of optical systems.

5. The lithography system according to claim 1, wherein there is a plurality of drawing apparatuses and the transmission unit is configured to transmit the pattern data selected from the plurality of types of pattern data to a drawing apparatus that uses the pattern data.

6. A method of manufacturing articles including causing a lithography system to perform drawing processing on a substrate and developing the drawn substrate,
wherein the lithography system comprises:
a drawing apparatus that includes a plurality of optical systems and draws a pattern on a substrate with beams having been respectively shaped by the plurality of optical systems, and
a transmission unit configured to select pattern data to be used by the drawing apparatus from a plurality of types of pattern data commonly used by the plurality of optical systems and configured to transmit the selected pattern data to the drawing apparatus,
wherein the pattern data is a set of data including a plurality of sub pattern data, and a width of a stripe-shaped drawing region corresponding to one sub pattern data piece is equivalent to a length obtainable by dividing a drawing width of the beams by an integer value.

* * * * *